United States Patent
Cheng

(10) Patent No.: US 7,733,170 B2
(45) Date of Patent: Jun. 8, 2010

(54) SWITCHING AMPLIFIER AND ITS MODULATION PROCESS

(75) Inventor: Jin Cheng, Shanghai (CN)

(73) Assignee: Apexone Microelectronics Ltd., Shanghai (CN)

(*) Notice: Subject to any disclaimer, the term of this patent is extended or adjusted under 35 U.S.C. 154(b) by 37 days.

(21) Appl. No.: 11/913,131

(22) PCT Filed: May 9, 2007

(86) PCT No.: PCT/CN2007/001522

§ 371 (c)(1),
(2), (4) Date: Mar. 17, 2008

(87) PCT Pub. No.: WO2008/138163

PCT Pub. Date: Nov. 20, 2008

(65) Prior Publication Data

US 2009/0115508 A1    May 7, 2009

(51) Int. Cl.
*H03F 3/38* (2006.01)
*H03F 3/217* (2006.01)

(52) U.S. Cl. .................................. 330/10; 330/207 A

(58) Field of Classification Search .................. 330/10, 330/207 A, 251
See application file for complete search history.

(56) References Cited

U.S. PATENT DOCUMENTS

| | | | |
|---|---|---|---|
| 3,585,517 A | 6/1971 | Herbert | |
| 2007/0279126 A1* | 12/2007 | Krishnan et al. | 330/10 |
| 2007/0279127 A1* | 12/2007 | Lee | 330/10 |

\* cited by examiner

*Primary Examiner*—Steven J Mottola
(74) *Attorney, Agent, or Firm*—Dickstein Shapiro LLP

(57) ABSTRACT

The present invention discloses a switching amplifier and its modulations process, which belongs to the field of non-filters-type switching amplifier. The switching amplifier comprises: pulse-width modulation with dual comparator, multiple-loop feedback structure, only one integrating amplifier with dual-ends output needed for each loop, no less than two feedback loops set between the integrating amplifier and H-bridge, in addition, no any low-pass filters needed adding to the feedback path. Multiple feedback loops are adopted in the present invention, which can low the distortion of the switching amplifier to the extent. Furthermore, no any extra low-pass filters are needed adding to the feedback path, which making the products a higher cost effectiveness.

21 Claims, 4 Drawing Sheets

US 7,733,170 B2

SWITCHING AMPLIFIER AND ITS MODULATION PROCESS

BACKGROUND OF THE INVENTION

1. Field of the Invention

The present invention relates to a switching amplifier and its modulation process, more particularly, it relates to a non-filter switching amplifier and its modulation process.

2. Description of Prior Art

A conventional pulse-width-modulation (PWM) D-type switching amplifiers with two level output needs output filters, which consisting of the extra inductor and capacitor generally, to reduce the electromagnetic interference (EMI). However, these output filters will increase the cost and size of the system. This has detrimental effects on the portable application.

The dual comparator modulation with three level output is generated in the prior art to overcome this defect. Although the dual comparator modulation does not need any output filters, it can make utmost of all the four work states of the H-bridge. It can send the current to the load only in demand, and the transported current will be completely consumed by the load self without any waste for the back discharge. The opposite power voltage applied on two ends of the load induces the elimination of the current modulation states, which makes it possible to connect the output of the H-bridge with the two ends of the load directly.

The U.S. Pat. No. 3,585,517 suggests a dual comparator modulation with three-level output. FIG. 1 shows one of its simplified schematic drawings. As is seen in FIG. 1, the input signal is sent to input 10, and then into the pulse-width modulator 12 by sum-edge 11. The other two inputs of said pulse-width modulator 12 are two triangular wave signals with a phase difference of 180° from the output 14 and 15 of the triangular wave generator, respectively. The PWM signal from the output 18 and 19 of said pulse-width modulator 12 (namely the input of the H-bridge) is sent to H-bridge 16. Output 20 and 21 on H-bridge 16 are connected with the two ends of load 17. The output pulse signal from output 20 and 21 on H-bridge 16 has the same pulse width to the PWM signal from input 18 and 19 on H-bridge. However, it has higher current driving ability. The output pulse signal from output 20 and 21 on the H-bridge is sent back to sum-edge 11 by the feedback loop.

FIG. 2A gives a typical circuit, which can realize said modulation, to generate the needed three-level output pulse in FIG. 1. Audio input signal 10 is connected with the forward input of two amplifiers of 28 and 29. The output of amplifier 28 is connected with its inverting input by capacitor 31. The inverting input of amplifier 28 is connected with one of the outputs of the H-bridge by resistor 30. Similarly, the output of amplifier 29 is connected with its inverting input by capacitor 33. The inverting input of amplifier 29 is connected with the other output of the H-bridge by resistor 32. One of the inputs of comparator 26 is connected with the output of amplifier 28, and another input is connected with trianglular wave output 15 of triangular wave generator 13. Similarly, one of the inputs of comparator 27 is connected with the output of amplifier 29, and another input is connected with another triangular wave output 14 of triangular wave generator 13. The triangular wave signals from 14 and 15 have the same amplitude, butbut with a phase difference of 180°. The outputs of comparator 26 and 27 are connected with two inputs of the H-bridge, respectively. The two outputs of the H-bridge are connected with two inputs of trumpet 17. The audio input signal and feedback output signal are integrated after being summarized by integral amplifier 28 and 29, and then the difference value between the input and output signals becomes to zero via negative feedback, so as to make the difference output of the H-bridge very close to the audio input. It should take notice that amplifier 28, capacitor 31 and resistor 30 form a low-pass filter essentially, which can provide the loop gain and attenuate the high-frequency component in the feedback output signal simultaneously. Similarly, amplifier 28, capacitor 31 and resistor 30 form another low-pass filter to realize the same function. Pulse-width modulator 34 consists of two comparators of 26 and 27.

FIG. 2B shows the waveforms related to the above dual comparator non-filter modulation. In FIG. 2B, if waveform 23 represents the triangular wave signal from input 14 of PWM 12, waveform 24 indicates the triangular wave signal from input 15 of PWM 12. These two triangular wave signal of 23 and 24 have a phase difference of 180°, but they have the same amplitude. The audio input signal, the number 25 in FIG. 2B, is denoted by the sine wave. The work process of PWM comprises: the area of shadow part, which coincided with audio signal 25 and triangular wave signal 23 and 24, corresponds to one of the forward or reverse pulses from two ends of load 17 (namely the trumpet); the area of the shadow will become larger with the amplitude increase of audio sine-wave signal 25, so the pulse width of the three-level forward or reverse square pulse 26 will also become larger; however, the pulse width of the square pulse will become smaller in FIG. 2B when the amplitude of audio signal 25 achieves the peak value and begins becoming smaller. Feedback loop ensures the waveform of the three-level output pulse, after being low-pass filtered, identical with the input audio sine-wave signal 25. The inner low-pass filtering characteristic of trumpet 17 and the response of mans' ear to audio frequency make this three-level pulse equivalently re-convert to analog audio signal.

FIG. 3A shows another circuit to generate the needed three-level output pulse in FIG. 1, which can realize the said modulation. FIG. 3B gives the waveforms related to this circuit. Similarly, PWM 35 in FIG. 3A consists of two comparators of 26 and 27. A full-differential audio input signal is sent to input 38 and 39, and then into the PWM 35 by integral amplifier 28 and 29 separately. At the same time, single triangular wave signal 40 is another signals sent into PWM 35, which is from output 37 of triangular wave generator 36. In FIG. 3B, waveform 41 and 42 indicate two complement signals of the full-differential audio input. Two output PWM signals from pulse width modulator 35 are sent to H-bridge 16, and finally appear on two ends of load 17. FIG. 3B shows the three-level pulse array on the load, which is consistent with the waveforms obtained in FIG. 2B. If the descriptions for the numbers are the same to that in FIG. 2A, please refer to the descriptions of the numbers in FIG. 2A.

Although the switching amplifier with dual comparator modulation, in the prior art, has more advantages over the traditional switching amplifier with single comparator modulation, the degree of distortion is still unsatisfying due to the non-linear characteristic of the power switching, which limits its advanced applications. Accordingly, the purpose of this invention is to provide a modulation technique with dual comparators, which has the better performance of total harmonic distortion (namely less distortion).

SUMMARY OF THE INVENTION

The object of the present invention is to provide a switching amplifier with higher performance and its modulation process to remove the aforesaid defects of the distortion in the prior art, and to make said switching amplifier with better performance of total harmonic distortion.

To achieve the above object of the present invention, a switching amplifier comprises: a first integrating amplifier to receive the differential audio input signal and then to output after integration; a second integrating amplifier to receive the signal from the output of the first integrating amplifier and then to output after integration; comparators, each comparator receiving the signal from the output of the second integrating amplifier and the triangular wave sampling signal; and the H-bridge circuit to receive the PWM signal from the dual comparator modulator and send it to the load; wherein, the output of the H-bridge circuit forms a dual feedback loop together with the inputs of the first and second integrating amplifier, respectively.

According to the present invention, the first and second integrating amplifier can respectively be double-ends integrating amplifiers, or each of them can consist of two single-end integrating amplifier.

According to the present invention, the triangular wave sampling signal is generated by a triangular wave generator.

According to the present invention, every feedback loop has a resistor individually, meanwhile, a resistor is also set in the circuit before the first integrating amplifier receives audio input signal. The closed-loop gain is determined by the ratio of these two resistors.

According to the present invention, every integrating amplifier individually comprises the capacitors set between the output and input.

To achieve the above object, the present invention also provides a switching amplifier comprising: two integrating amplifiers to receive and output the input differential audio signal after integration and amplification; a PWM to receive the output signal from no less than two integrating amplifiers while receiving the sampling signal; and the H-bridge circuit to receive PWM signal from the comparator modulator and send it to the load, wherein, the output of the H-bridge feeds back directly to the inputs of no less than two integrating amplifiers, which forming no less than two feedback loops.

According to the present invention, the sampling signal is triangular wave signal or sawtooth wave signal.

According to the present invention, the PWM is a dual comparator modulator.

According to the present invention, the integrating amplifier can be a dual comparator or consist of two single-end integrating amplifiers.

According to the present invention, every feedback loop has a resistor individually, meanwhile, a resistor is also set in the circuit before the first integrating amplifier receiving audio input signal. The closed-loop gain is determined by the ratio of these two resistors.

According to the present invention, every integrating amplifier individually comprises the capacitors set between the output and input.

To achieve the above object, the present invention also provides a modulation process for a switching amplifier, which comprising:

Step 1, to receive differential input signal.

Step 2, to output the said input differential signal by no less than two integrating amplifiers.

Step 3, to send the output signal from the integrating amplifiers to the H-bridge circuit after pulse-width modulating.

Step 4, the H-bridge outputs signals to the load, and meanwhile the signals form respectively no less than two feedback loops, which feeding back to the inputs of the said no less than two integrating amplifiers, where they are outputted after the summarization and integration with their respective input signal of no less than the said integrating amplifiers.

Compared with the prior art, the present invention provides a circuit and process of a switching amplifier with multiple-loop feedback and dual comparator pulse-width modulation. It has the characteristics such as compactor structure, lower total harmonic distortion, etc. The dual comparator PWM techniques can make the load to generate output three-level pulses without the use of output filters. Meanwhile, the adopted multiple-loop feedback can make the distortion of this switching amplifier to be the lowest. The present optimized circuit and process can make the switching amplifiers work without any extra low-pass filters in the feedback path, and hence to keep the effectively low-cost of the products.

BRIEF DESCRIPTION OF THE DRAWINGS

The present invention may best be understood through the following description with reference to the accompanying drawings, in which.

DETAILED DESCRIPTION OF THE INVENTION

The embodiments of the invention will be described in detail by referring to the figures as follows. It should be noted that the figures are used only for the readers to understand easily the embodiments of the invention; they cannot be understood as the end description of the invention or the limitation on the scope of the Claims. Besides, the figures do not need to be drawn in proportion.

It should be point out firstly that the inventors get the conclusions from the experiments and theories, which comprise: one of the most important characteristics of the 'negative feedback' technique is to suppress the non-linear characteristic of the analog circuit, the more feedback loops, and the more powerful suppression to the distortion. Therefore, the multiple 'feedback' technique will be applied to the switching amplifier in the present invention by the integration of the experiments and theories, especially, to a PWM switching amplifier with dual comparator to get the better performance of total harmonic distortion.

Figure 4:
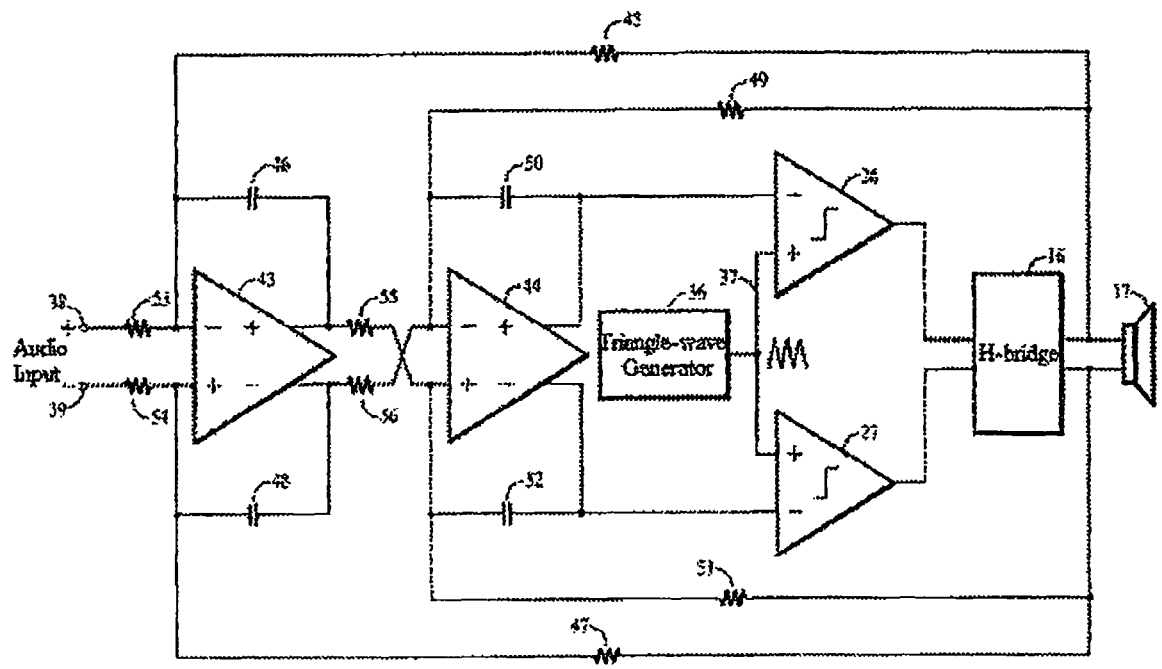
FIG. 4 illustrates a detailed circuit of the said PWM switching amplifier in the present invention having the following characteristics: dual comparator, multiple feedback loops, each feedback loop having only a fully-differential integrating amplifier, and each feedback path needing to adding no any extra low-pass filter.

Various embodiments of the invention can realize the said combination of the multiple feedback technique with dual comparator PWM to get the technical solution obtaining lower distortion and non-filter switching amplifier. FIG. 4 shows a preferred embodiment of the invention, namely, an amplifier circuit having two feedback loops and its implementations. According to FIG. 4, differential audio input 38 and 39 are respectively connected with the inverting input and forward input of integrating amplifier 43 by resistor 53 and 54. Capacitor 46 is cross-connected from the inverting input to the forward output of integrating amplifier 43. In Parallel, capacitor 48 is cross-connected from the forward input to the inverting output of integrating amplifier 43. The forward output of integrating amplifier 43 is connected to the forward input of amplifier 44 by resistor 55. In Parallel, the inverting output of integrating amplifier 43 is connected to the inverting input of the amplifier 44 by resistor 56. Capacitor 50 is cross-connected from the inverting input to the forward output of integrating amplifier 44. In Parallel, capacitor 52 is cross-connected from the forward input to the inverting output of integrating amplifier 44. The forward inputs of comparator 26 and 27 are all connected with triangle signal output 37 of triangular wave generator 36. (Here, it should be noted that, a triangular wave is the ideal as a sampling waveform, of cause, it can also be other similar waveform such as sawtooth wave, etc.) The inverting inputs of comparator 26 and 27 are connected with the forward and inverting output of integrating amplifier 44, respectively. The outputs of comparator 26 and 27 are connected with two outputs of H-bridge 16, respectively. Two outputs of H-bridge 16 (the output square wave signal from the H-bridge) are connected with two inputs of load 17 (it is the trumpet in the preferred embodiment of the invention). One output of H-bridge 16 feeds back to the inverting input of integrating amplifier 43 and 44 by resistor 45 and 49, respectively. In Parallel, the other output of H-bridge 16 feeds back to the forward input of integrating amplifier 43 and 44 by resistor 47 and 51, respectively, as seen in FIG. 4. Integrating amplifier 43 and capacitor 46 and 48 and resistor 45 and 47 in the outside feedback loop essentially form a low-pass filter, which can attenuate the high-frequency component of the output signal from the feedback during providing the loop gain. Thus, it is not necessary to add the extra low-pass filter into the feedback path of the output signal.

It should also be noted that, in the present invention, the forward and inverting I/O puts are selected to be connected with the forward or inverting puts according to the actual requirement, the other structures being changed accordingly. In the said embodiment, for example, the inverting input comparator 26 and 27 can be connected with triangular wave output 37 of triangular wave generator 36, while the forward input is connected with the forward and inverting output.

Figure 1:
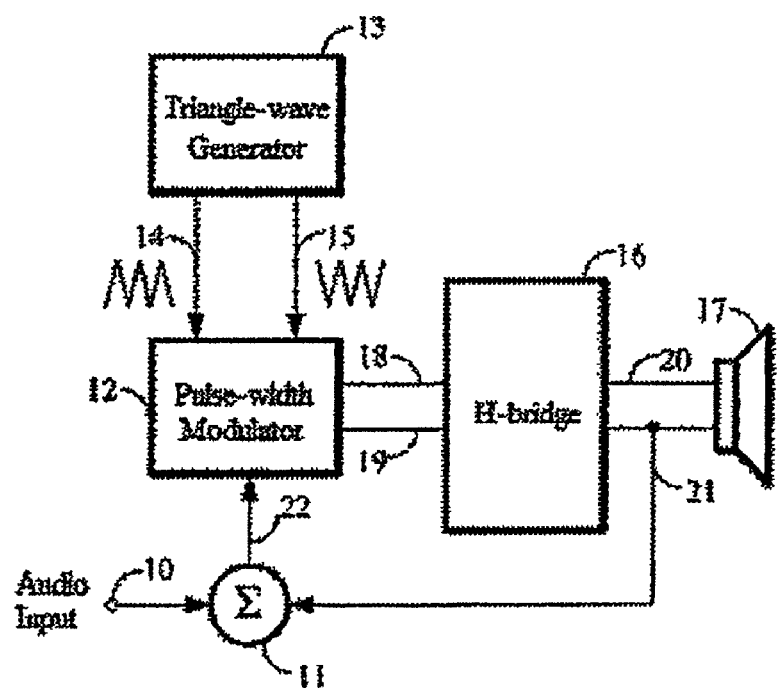
FIG. 1 is a schematic block diagram illustrated a PWM switching amplifier with dual comparator in the prior art.
Figure 2A:
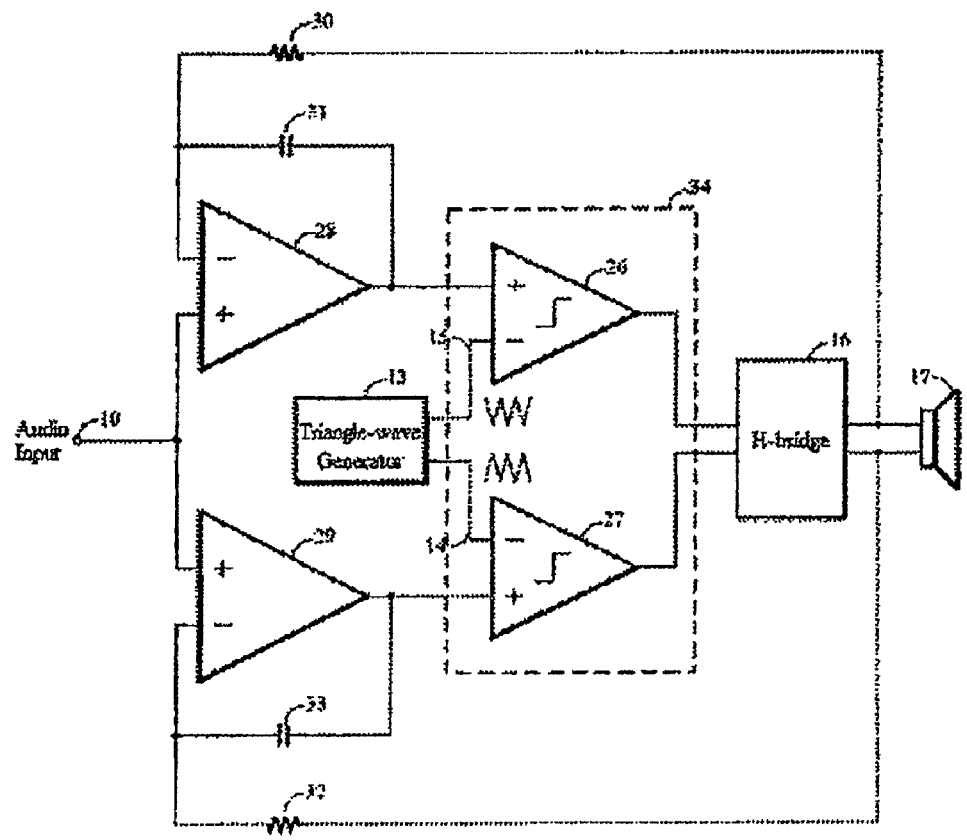
FIG. 2A shows a typical circuit diagram of a PWM switching amplifier with dual comparator, modulated by two complementary triangular wave signals.
Figure 2B:
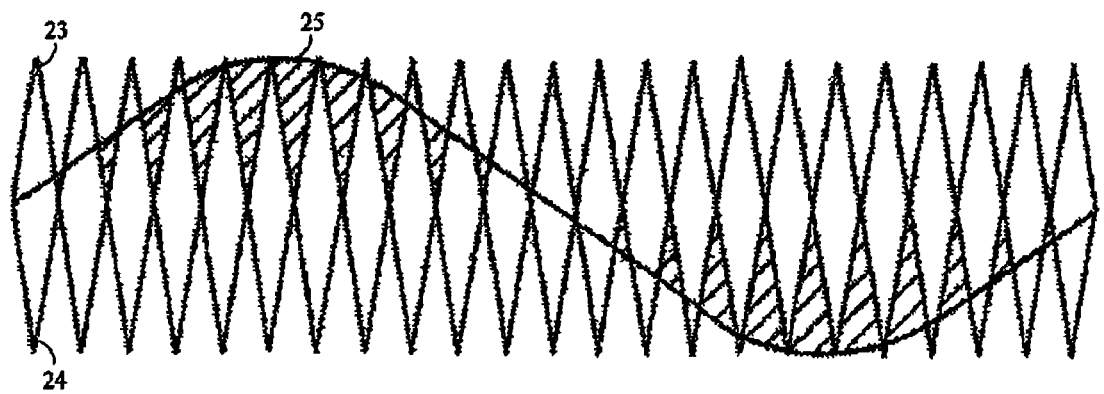
FIG. 2B illustrates the related working waveforms for the amplifier showed in FIG. 2A.
Figure 2B:
Figure 3A:
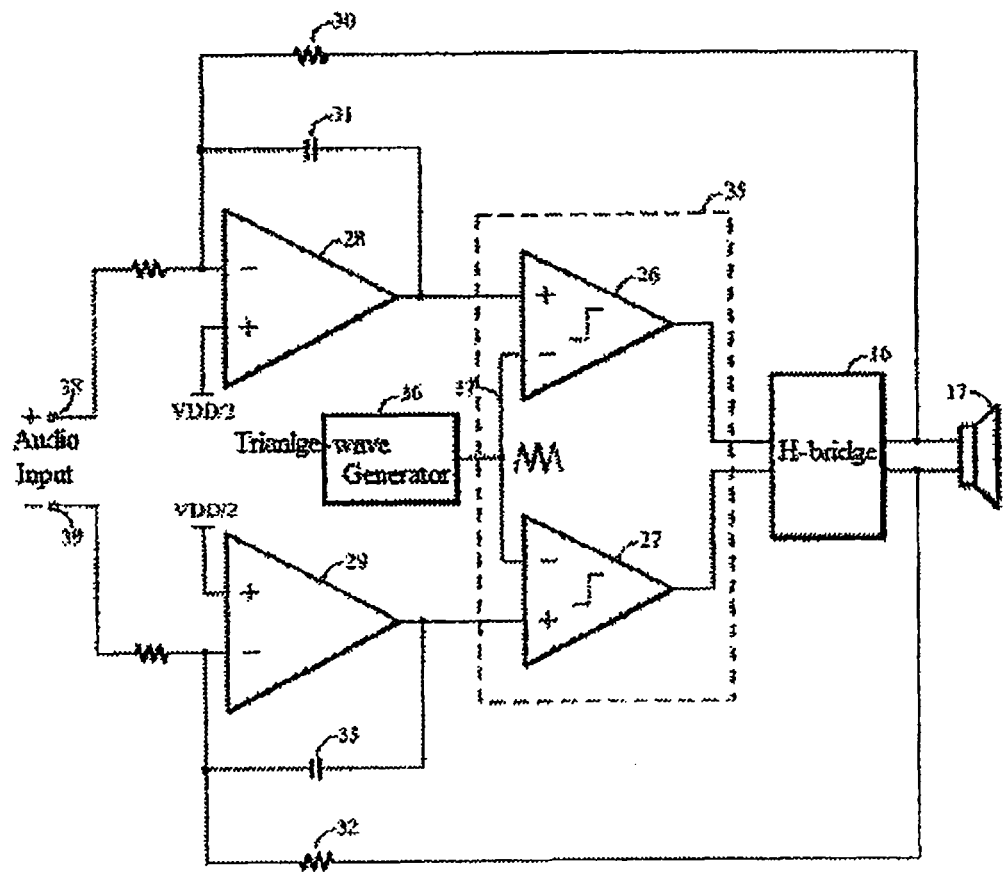
FIG. 3A is shows another circuit diagram of a PWM switching amplifier with dual comparator, modulated by single triangular wave signals.
Figure 3B:
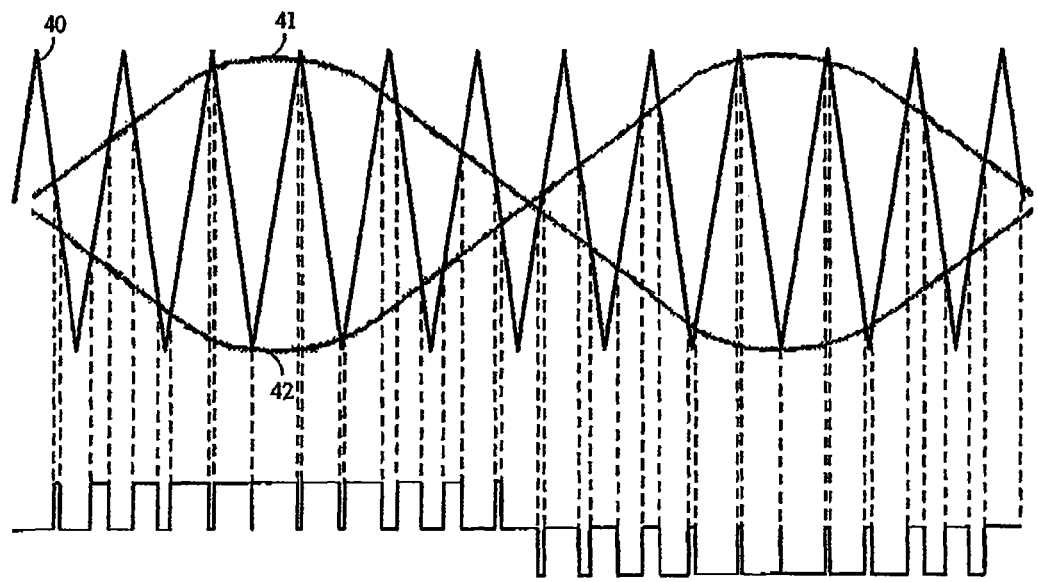
FIG. 3B illustrates the related working waveforms for the amplifier showed in FIG. 3A.

Obviously, in FIG. 4, integrating amplifiers 28 and 29 with single-end output in FIG. 3A have been combined into an integrating amplifier of 43 with dual-end output. It can be understood easily that, for other embodiments of the present invention, the integrating amplifier with dual-end output can be separated into two integrating amplifiers with single-end output according to the requirement.

Meanwhile, how the capacitors and resistors to be set is determined by the actual needs, and their sizes are adjusted also according to the actual needs.

The said integrating amplifier 43 integrates the audio input signal and the output signal from the outside feedback after summarizing, meanwhile, the difference between input and output signals becomes very small because of the outside negative feedback, which leads to the differential output of the H-bridge being very closed to the audio input. Similarly, the second integrating amplifier 44 integrates the output signal of integrating amplifier 43 and the output signal from inside feedback after summarizing; meanwhile, the difference between the two signals becomes very small because of the inside negative feedback, which induces the differential output of the H-bridge to be much exactly closed to the audio input. The close-loop gain is determined by the ratio of resistor 45 to 53.

The present invention provides a circuit for a dual comparator PWM switching amplifier with dual-loop feedback and its implementations. It has the characteristics such as compactor structure, lower total harmonic distortion, etc.

The dual comparator PWM can make the load instead of the output filters to generate the output three-level pulse. The adopted dual feedback loop can make the distortion of this switching amplifier to be very low. Meanwhile the effect can be got only from linear amplifiers. The optimized circuit structure can be easily formed when every feedback loop has individually only one fully-differential integrating amplifier, but it can directly feed back without any other lowpass filter added to the feedback path, which makes the products very high cost-effectiveness. True, to pursue the better performance against the distortion, the dual-loop feedback can increase to three-loop, four-loop feedback and so on; an extra low-pass filter can also be added according to the actual needs.

Figure 5:
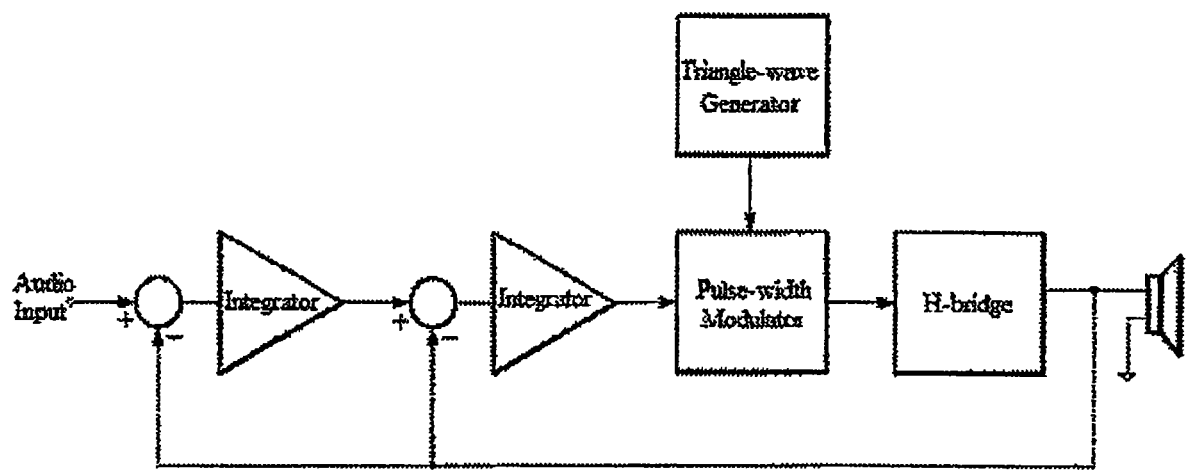
FIG. 5 illustrates the schematic drawing of the switching amplifier and its process in the present invention.

FIG. 5 is a schematic drawing for the switching amplifier and its implementation in the present invention. In the invention, under the condition of pulse-width modulation, no less than two feedback loops have been added between the integrating amplifier and H-bridge to obtain better performance against distortion, furthermore to get the benefit of smaller size and lower cost with the precondition that any extra low-pass filter is not needed here.

The detail embodiment of the present invention above, but they cannot be understood as the limitation on the scope of the invention. Similar feedback structure with two or more loops can be easily derived from FIG. 4 or FIG. 5 for those skilled in the art. Thus, any modifications and/or changes based on the said embodiment also belong to the present invention.

What is claimed is:

1. A switching amplifier comprising:
   a first integrating amplifier which receives a differential input signal and then outputs the signal after integrating it;
   a second integrating amplifier which receives the signal from the output of the first integrating amplifier and then outputs the signal after integrating it;
   dual comparators, each of which receives the output signal of the second integrating amplifier and a triangular wave sampling signal; and
   an H-bridge circuit which receives a pulse-width modulation signal from the dual comparator modulator and sends it to a load;
   wherein the output of the H-bridge circuit and the inputs of the first and second integrating amplifier respectively forming a dual feedback loop.

2. A switching amplifier according to claim 1, wherein said first and second integrating amplifiers are fully differential integrating amplifiers, respectively.

3. A switching amplifier according to claim 1, wherein said first and second integrating amplifiers consist of two single-end integrating amplifiers, respectively.

4. A switching amplifier according to claim 1, wherein said triangular wave sampling signals are generated by a triangular wave generator.

5. A switching amplifier according to claim 1, wherein said every feedback loop has a resistor individually and a resistor is also set in the circuit before the first integrating amplifier receiving audio inputs signal, and the closed-loop gain is determined by the ratio of these two resistors.

6. A switching amplifier according to claim 1, wherein said each integrating amplifier contains capacitors set between the output and input.

7. A switching amplifier comprising:
no less than two integrating amplifiers, which receives and outputs the input differential audio signal after integrating and amplifying;
a pulse width modulator which receives the output signal from said no less than two integrating amplifiers while receiving the sampling signal; and
an H-bridge circuit which receives a pulse-width modulation signal from the pulse width modulator and sends it to a load;
wherein said no less than two integrating amplifiers are cascaded and the output square-wave signals of the H-bridge are feed back simultaneously directly to the inputs of each of said cascaded no less than two integrating amplifiers, forming no less than two feedback loops.

8. A switching amplifier according to claim 7, wherein said sampling signal is a triangular wave signal.

9. A switching amplifier according to claim 7, wherein said sampling signal is a sawtooth wave signal.

10. A switching amplifier according to claim 7, wherein said pulse-width modulator is a dual comparator.

11. A switching amplifier according to claim 7, wherein said no less than two integrating amplifiers are fully differential integrating amplifiers.

12. A switching amplifier according to claim 7, wherein said no less than two integrating amplifiers consist of two single-end integrating amplifiers respectively.

13. A switching amplifier according to claim 7, wherein said each feedback loop has an individual resistor set in the circuit before the first integrating amplifier receiving audio input signal, and the closed-loop gain is determined by the ratio of these two resistors.

14. A switching amplifier according to claim 7, wherein said each integrating amplifier contains a capacitor set between the output and input.

15. A modulation process for a switching amplifier comprising:
receiving a differential input signal;
outputting the input differential signal by no less than two cascaded integrating amplifiers;
sending the output signal from the integrating amplifiers to a H-bridge circuit after pulse-width modulating; and
the H-bridge outputs signals sent to the load, form respectively no less than two feedback loops, while feeding back simultaneously to the inputs of each of said cascaded no less than two integrating amplifiers, and then they are outputted after the summarization and integration with their respective input signal of said no less than two integrating amplifiers.

16. A modulation process for the switching amplifier according to claim 15, wherein said no less than two integrating amplifiers are fully differential integrating amplifiers, respectively, in step 2.

17. A modulation process for the switching amplifier according to claim 15, wherein said no less than two integrating amplifiers consist of two single-end integrating amplifiers each, respectively, in step 2.

18. A modulation process for the switching amplifier according to claim 15, wherein a dual comparator, in step 3 is used to receive the output signal and sampling signal at the same time and to output the signals to the H-bridge after pulse-width modulation.

19. A modulation process for the switching amplifier according to claim 18, wherein said sampling signal is a triangular wave or sawtooth wave signal.

20. A modulation process for the switching amplifier according to claim 15, wherein said each feedback loop formed has a resistor individually and a resistor is also set in the circuit before the first amplifier receiving audio input signal, the closed-loop gain is determined by the ratio of these two resistors.

21. A modulation process for the switching amplifier according to claim 15, wherein said each integrating amplifier contains the capacitors set between the output and input.

* * * * *